(12) United States Patent
Takaishi et al.

(10) Patent No.: US 9,190,615 B2
(45) Date of Patent: Nov. 17, 2015

(54) RESISTANCE RANDOM ACCESS MEMORY DEVICE

(71) Applicant: Kabushiki Kaisha Toshiba, Minato-ku (JP)

(72) Inventors: Riichiro Takaishi, Kanagawa-ken (JP); Hidenori Miyagawa, Kanagawa-ken (JP); Shosuke Fujii, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/460,148

(22) Filed: Aug. 14, 2014

(65) Prior Publication Data

US 2014/0353572 A1    Dec. 4, 2014

Related U.S. Application Data

(62) Division of application No. 14/020,345, filed on Sep. 6, 2013, now Pat. No. 8,860,182.

(60) Provisional application No. 61/804,406, filed on Mar. 22, 2013.

(51) Int. Cl.
*H01L 45/00* (2006.01)
*H01L 27/24* (2006.01)

(52) U.S. Cl.
CPC .......... *H01L 45/145* (2013.01); *H01L 27/2463* (2013.01); *H01L 27/2481* (2013.01); *H01L 45/04* (2013.01); *H01L 45/085* (2013.01); *H01L 45/1233* (2013.01); *H01L 45/1253* (2013.01); *H01L 45/1266* (2013.01); *H01L 45/1641* (2013.01)

(58) Field of Classification Search
CPC . H01L 45/1233; H01L 45/04; H01L 27/2463; H01L 27/2481
See application file for complete search history.

(56) References Cited

U.S. PATENT DOCUMENTS

| | | | |
|---|---|---|---|
| 7,169,635 B2 | 1/2007 | Kozicki |
| 7,288,781 B2 | 10/2007 | Kozicki |
| 7,829,930 B2 | 11/2010 | Terao et al. |
| 8,735,215 B2 | 5/2014 | Park et al. |
| 8,742,391 B2 | 6/2014 | Mizushima et al. |
| 8,759,806 B2 | 6/2014 | Yamaguchi et al. |
| 2009/0014707 A1 | 1/2009 | Lu et al. |
| 2009/0014770 A1 | 1/2009 | Terao et al. |
| 2010/0085798 A1 | 4/2010 | Lu et al. |
| 2010/0102290 A1 | 4/2010 | Lu et al. |

(Continued)

FOREIGN PATENT DOCUMENTS

| | | |
|---|---|---|
| JP | 2009-21431 | 1/2009 |
| JP | 2009-49183 | 3/2009 |

*Primary Examiner* — Ngan Ngo
(74) *Attorney, Agent, or Firm* — Oblon, McClelland, Maier & Neustadt, L.L.P.

(57) ABSTRACT

A resistance random access memory device according to an embodiment includes a first electrode, a second electrode and a variable resistance film provided between the first electrode and the second electrode. The second electrode includes material selected from the group consisting of silver, copper, zinc, gold, titanium, nickel, cobalt, tantalum, aluminum, and bismuth, alloys thereof, and silicides thereof. The variable resistance film includes silicon oxynitride. The variable resistance film includes a first resistance change layer having a first nitrogen concentration and a second resistance change layer having a second nitrogen concentration lower than the first nitrogen concentration.

10 Claims, 5 Drawing Sheets

(56) References Cited

U.S. PATENT DOCUMENTS

| | | |
|---|---|---|
| 2012/0012807 A1 | 1/2012 | Yamaguchi et al. |
| 2012/0241709 A1* | 9/2012 | Tsuji .................................. 257/2 |
| 2012/0319077 A1* | 12/2012 | Yasuda et al. ..................... 257/5 |
| 2013/0026438 A1* | 1/2013 | Wang et al. ....................... 257/4 |
| 2013/0210193 A1 | 8/2013 | Lee et al. |
| 2013/0270506 A1 | 10/2013 | Mizushima et al. |
| 2013/0295745 A1 | 11/2013 | Takahashi et al. |
| 2014/0126269 A1 | 5/2014 | Tran |

* cited by examiner

FIG. 6B

RESISTANCE RANDOM ACCESS MEMORY DEVICE

CROSS-REFERENCE TO RELATED APPLICATIONS

This application is a division of and claims the benefit of priority under 35 U.S.C. §120 from U.S. Ser. No. 14/020,345 filed Sep. 6, 2013, and claims the benefit of priority from U.S. Provisional Patent Application 61/804,406 filed Mar. 22, 2013; the entire contents of each of which are incorporated herein by reference.

FIELD

Embodiments described herein relate generally to a resistance random access memory device.

BACKGROUND

As in the past, extensive research of nonvolatile memory such as flash memory, etc., was performed; and one such nonvolatile memory that utilizes the change of an electrical resistance value has been proposed. In such memory, a structure is formed in which the resistance value inside a memory element is changed by an electric field; and different logical values are retained.

A method in which ion movement is used has been proposed as a method for changing the electrical resistance value. In such memory, a variable resistance film made of an insulating material is disposed between an opposing electrode and a metal electrode that supplies metal ions; the metal ions from the metal electrode are generated by an electric field; conductive filaments are formed inside the variable resistance film; and the memory element is switched to a low resistance state. On the other hand, the memory element is switched to a high resistance state by causing the filaments to disappear by returning the metal ions to the metal electrode by an electric field having a reverse orientation.

BRIEF DESCRIPTION OF THE DRAWINGS

FIG. 2A and FIG. 2B are schematic cross-sectional views showing operations of the resistance random access memory device according to the first embodiment; FIG. 2A shows a low resistance state; and FIG. 2B shows a high resistance state;

FIG. 4A to FIG. 4C are graphs showing X-ray photoelectron spectra of the variable resistance film, where the horizontal axis is the binding energy, and the vertical axis is the intensity of the photoelectrons; FIG. 4A shows the 2p orbital (Si 2p) photoelectron spectrum; FIG. 4B shows the 1s orbital (N 1s) photoelectron spectrum of nitrogen; and FIG. 4C shows the 1s orbital (O 1s) photoelectron spectrum of oxygen;

DETAILED DESCRIPTION

A resistance random access memory device according to an embodiment includes a first electrode, a second electrode and a variable resistance film provided between the first electrode and the second electrode. The second electrode includes material selected from the group consisting of silver, copper, zinc, gold, titanium, nickel, cobalt, tantalum, aluminum, and bismuth, alloys thereof, and silicides thereof. The variable resistance film includes silicon. The variable resistance film includes a first resistance change layer having a first nitrogen concentration and a second resistance change layer having a second nitrogen concentration lower than the first nitrogen concentration.

Embodiments of the invention will now be described with reference to the drawings.

First Embodiment

Figures 1A, 1B:
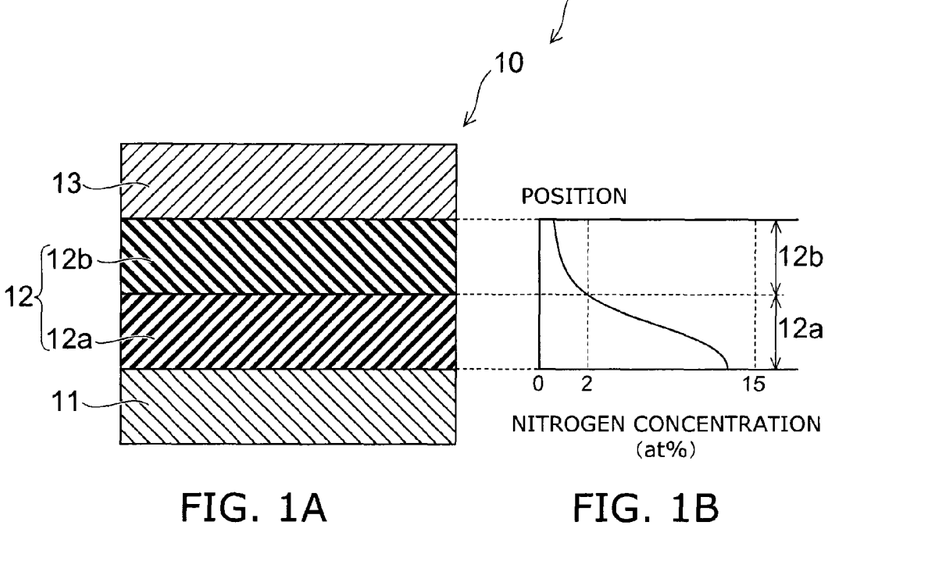
FIG. 1A is a cross-sectional view showing a resistance random access memory device according to a first embodiment.
FIG. 1B is a graph showing the nitrogen concentration profile inside the variable resistance film, where the vertical axis is the position in the film thickness direction of the variable resistance film, and the horizontal axis is the nitrogen concentration.

FIG. 1A is a cross-sectional view showing a resistance random access memory device according to the embodiment; and FIG. 1B is a graph showing the nitrogen concentration profile inside the variable resistance film, where the vertical axis is the position in the film thickness direction of the variable resistance film, and the horizontal axis is the nitrogen concentration. The position of the vertical axis of FIG. 1B corresponds to the position of FIG. 1A.

As shown in FIG. 1A, an opposing electrode 11, a variable resistance film 12, and an ion source electrode 13 are stacked in this order in a memory element 10 of the resistance random access memory device 1 according to the embodiment.

Any conductive material such as a metal, a semiconductor, etc., can be used as the material of the opposing electrode 11. For example, impurity-doped silicon in which boron (B), arsenic (As), phosphorus (P), or the like is introduced to silicon (Si) at a high concentration to have a resistivity not more than 0.005 Ωcm can be used as the material of the opposing electrode 11.

The variable resistance film 12 is formed of silicon oxynitride (SiON); and the variable resistance film 12 is a two-layer film in which resistance change layers 12a and 12b are stacked. For example, the resistance change layer 12a is disposed on the opposing electrode 11 side; and the resistance change layer 12b is disposed on the ion source electrode 13 side. The thickness of the entire variable resistance film 12 is, for example, not more than 4 nm.

The thickness of the resistance change layer 12a is not more than 1 nm; and the nitrogen concentration of the resistance change layer 12a is not less than 2 at % and not more than 15 at %. The thickness and the nitrogen concentration of the resistance change layer 12a is determined from an X-ray photoelectron spectrum and is calculated based on, for example, the peak appearing in the region of 396 to 398 eV due to the (N 1s) X-ray photoelectron spectrum.

Also, the nitrogen concentration of the resistance change layer 12b is less than 2 at % and not less than 0 at %. The nitrogen concentration is determined from an X-ray photoelectron spectrum and is calculated based on, for example, the peak appearing in the region of 398 to 400 eV due to the (N 1s) X-ray photoelectron spectrum. There also may be cases where the nitrogen concentration of the resistance change layer 12b is 0 at %. In such a case, the resistance change layer 12b is formed of silicon oxide. Also, the nitrogen concentration inside the resistance change layer 12b may have a gradient; a portion of the resistance change layer 12b may be silicon oxynitride; and the remaining portion may be formed of silicon oxide.

As shown in FIG. 1B, when the variable resistance film 12 is considered as an entirety, the variable resistance film 12 contains silicon (Si), oxygen (O), and nitrogen (N); and the nitrogen concentration of the variable resistance film 12 has a gradient in the thickness direction. The nitrogen concentration inside the variable resistance film 12 is relatively high on the opposing electrode 11 side and relatively low on the ion source electrode 13 side. However, the maximum value of the nitrogen concentration is not more than 15 at %. Further, the portion of the variable resistance film 12 where the nitrogen concentration is less than 2 at % is the resistance change layer 12b; and the portion of the variable resistance film 12 where the nitrogen concentration is not less than 2 at % and not more than 15 at % is the resistance change layer 12a. Considering charge balance of each atom, the ratio of total amount of the nitrogen and the oxygen to silicon amount in the silicon oxynitride of the variable resistance film 12 is substantially constant. Therefore, the oxygen concentration inside the variable resistance film 12 is relatively high on the ion source electrode 13 side and relatively low on the opposing electrode 11 side. The ion source electrode 13 is formed of a conductive material including a metal. More specifically, the ion source electrode 13 includes one type of metal selected from the group consisting of silver (Ag), copper (Cu), zinc (Zn), gold (Au), titanium (Ti), nickel (Ni), cobalt (Co), tantalum (Ta), aluminum (Al), and bismuth (Bi), or an alloy or a silicide including at least one type of metal selected from the group.

Operations of the resistance random access memory device according to the embodiment will now be described.

Figure 2A:
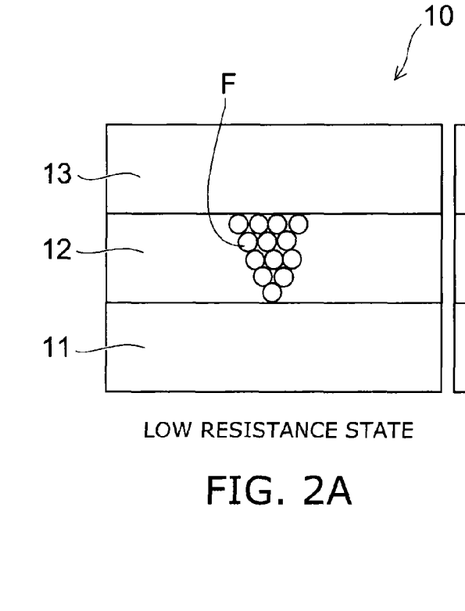
Figure 2B:
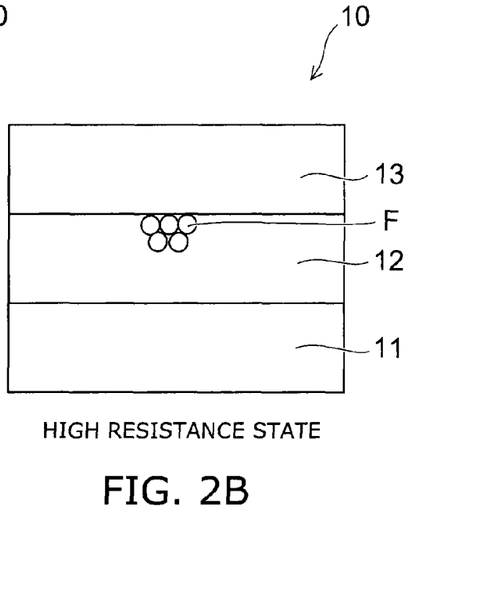

FIG. 2A and FIG. 2B are schematic cross-sectional views showing operations of the resistance random access memory device according to the embodiment; FIG. 2A shows a low resistance state; and FIG. 2B shows a high resistance state.

In the resistance random access memory device 1 as shown in FIG. 2A, the resistance state of the memory element 10 changes from the high resistance state to the low resistance state by a filament F that is conductive being formed of the metal atoms supplied from the ion source electrode 13 inside the variable resistance film 12. Further, as shown in FIG. 2B, the resistance state of the memory element 10 changes from the low resistance state to the high resistance state due to the filament F shrinking due to the metal atoms of the filament F being recovered by the ion source electrode 13.

More specifically, when forming the filament F as shown in FIG. 2A, a set voltage in the positive direction is applied to the memory element 10 to cause the ion source electrode 13 to have a higher potential than the opposing electrode 11. Thereby, the metal atoms inside the ion source electrode 13 are ionized and enter the variable resistance film 12; and electrons are supplied to the variable resistance film 12 via the opposing electrode 11. Then, the metal atoms precipitate by the metal ions and the electrons combining inside the variable resistance film 12; and the filament F grows. Then, the memory element 10 is set to the low resistance state by the filament F that has grown shorting the opposing electrode 11 and the ion source electrode 13.

On the other hand, to cause the filament F to disappear as shown in FIG. 2B, a reset voltage in the reverse direction is applied to the memory element 10 to cause the ion source electrode 13 to have a lower potential than the opposing electrode 11. Thereby, the metal atoms of the filament F are ionized, move toward the ion source electrode 13, combine with the electrons inside the ion source electrode 13, and again become metal atoms. As a result, at least a portion of the filament F inside the variable resistance film 12 disappears; and the memory element 10 is set to the high resistance state.

Thus, because reversible control of the formation and disappearance of the filament F of the variable resistance film 12 is possible, reversible control of the resistance change also is possible. In such a case, data can be programmed to the memory element 10 by associating the high resistance state with the off-state and the low resistance state with the on-state. The data that is programmed to the memory element 10 can be read by discriminating between the on-state and the off-state by reading the value of the current flowing in the memory element 10 when a positive read-out voltage that is lower than the set voltage described above is applied. Thus, the memory element 10 can be caused to operate as a memory cell. Further, a nonvolatile memory can be realized because the transition between the high resistance state and the low resistance state occurs only when the set voltage and the reset voltage are applied.

Effects of the resistance random access memory device according to the first embodiment will now be described.

In the embodiment, the variable resistance film 12 is formed of silicon oxynitride; the variable resistance film 12 is a stacked film of the two layers of the resistance change layers 12a and 12b; the nitrogen concentration of the resistance change layer 12a is set to be not less than 2 at % and not more than 15 at %; and the nitrogen concentration of the resistance change layer 12b is set to be less than 2 at %. Thereby, the natural disappearance of the filaments once formed can be suppressed; and the retention characteristics of the data can be improved.

Moreover, compared to the resistance change layer 12a, the filaments of the resistance change layer 12b are formed easily and disappear easily. Thereby, after the filament F is formed inside the variable resistance film 12 by the set operation described above, the portion of the filament F formed inside the resistance change layer 12b naturally disappears. Therefore, the on-state current does not flow in the variable resistance film 12 even when a voltage in the reverse direction having a magnitude about the same as that of the read-out voltage is applied to the memory element 10. On the other hand, when a read-out voltage in the positive direction is applied to the memory element 10, the filament F inside the resistance change layer 12b is re-formed; and the on-state current flows. Thereby, the memory element 10 can have a rectifying property.

For example, a rectifying layer including silicon such as amorphous silicon, polysilicon, etc., or a rectifying layer including a metal oxide such as hafnium oxide, etc., may be provided between the opposing electrode 11 and the variable resistance film 12 or between the variable resistance film 12 and the ion source electrode 13. Thereby, the rectifying property of the memory element 10 can be realized more reliably.

Further, the stacking order of the resistance change layer 12a and the resistance change layer 12b in the variable resistance film 12 may be reversed. In other words, the resistance change layer 12a may be disposed on the ion source electrode 13 side; and the resistance change layer 12b may be disposed on the opposing electrode 11 side. In such a case, for example, the nitrogen concentration inside the variable resistance film 12 is relatively low on the opposing electrode 11 side and relatively high on the ion source electrode 13 side. Also, the oxygen concentration inside the variable resistance film 12 is relatively high on the opposing electrode 11 side and relatively low on the ion source electrode 13 side.

Second Embodiment

The embodiment is an embodiment of a method for manufacturing the resistance random access memory device according to the first embodiment described above and a method for measuring the thickness and the nitrogen concentration of the resistance change layer.

The case where the opposing electrode 11 is formed of p-type silicon and the ion source electrode 13 is formed of silver (Ag) will now be described as an example.

First, the method for manufacturing the resistance random access memory device according to the embodiment will be described.

First, for example, boron is ion-implanted into a silicon substrate that is monocrystalline using the conditions of an acceleration voltage of 30 keV and a dose of $2 \times 10^{15}$ cm$^{-2}$; and subsequently, activation annealing is performed. Thus, the p-type region formed inside the silicon substrate is used as the opposing electrode 11.

Then, the variable resistance film 12 is formed by depositing silicon oxynitride onto the opposing electrode 11 by CVD (chemical vapor deposition). At this time, the nitrogen concentration inside the silicon oxynitride is controlled to individually make the resistance change layer 12a that has a relatively high nitrogen concentration and the resistance change layer 12b that has a relatively low nitrogen concentration by changing the composition of the source-material gas, e.g., the mixing ratio of silane, ammonia, and nitrous oxide. At this time, the nitrogen concentration at the interface between the resistance change layer 12a and the resistance change layer 12b may change discontinuously or may change continuously as shown in FIG. 1B. In the case where the nitrogen concentration changes continuously, the resistance change layer 12a and the resistance change layer 12b may be discriminated for convenience by using a position where the nitrogen concentration is 2 at % as a reference. The variable resistance film 12 may be formed by atomic layer deposition or may be formed by performing post-nitriding after forming the silicon oxide film.

Continuing, the ion source electrode 13 is formed by vapor-depositing silver on the variable resistance film 12. Thereby, the memory element 10 shown in FIG. 1 can be made.

The method for measuring the thickness and the nitrogen concentration of the resistance change layer will now be described.

In the embodiment, the nitrogen concentration and the thickness of the resistance change layers 12a and 12b are measured by X-ray photoelectron spectroscopy. The description hereinbelow is the analysis result of a sample in which the variable resistance film 12 that is made of silicon oxynitride is formed on the opposing electrode 11 made of p-type silicon. The ion source electrode 13 is not provided in the sample.

Figure 3:
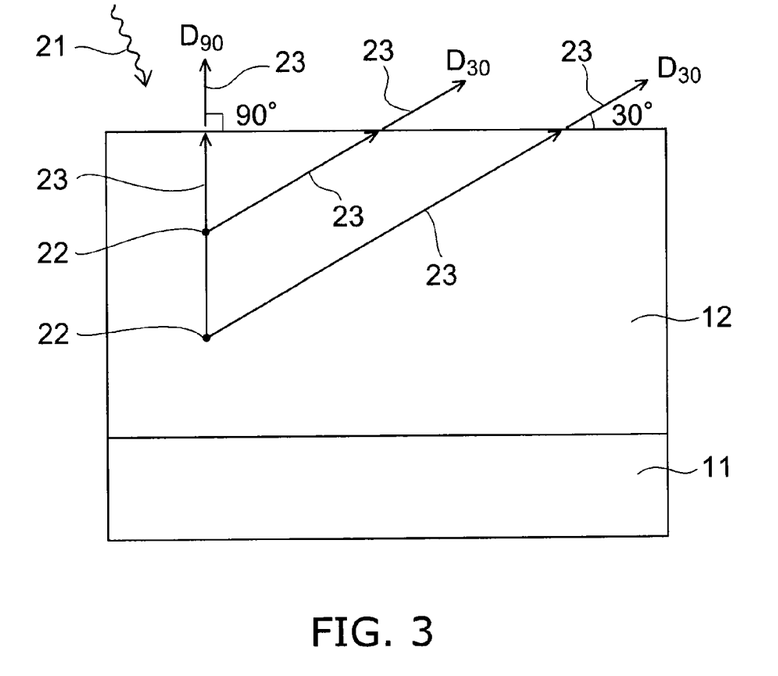
FIG. 3 is a drawing showing the X-ray photoelectron spectroscopy used in a second embodiment.

FIG. 3 is a drawing showing the X-ray photoelectron spectroscopy used in the embodiment.

When an X-ray 21 is irradiated onto the variable resistance film 12 as shown in FIG. 3, photoelectrons 23 having an energy corresponding to the binding states of atoms 22 existing inside the variable resistance film 12 are radiated from the atoms 22. At this time, the photoelectrons 23 attenuate and the intensity of the photoelectrons 23 decreases as the optical path of the photoelectrons 23 traveling through the variable resistance film 12 lengthens. In the embodiment, the photoelectrons 23 are detected in multiple directions that are different from each other. For example, the detection is performed at a direction $D_{90}$ which is at an angle of 90° from the surface of the variable resistance film 12 and at a direction $D_{30}$ which is at an angle of 30° from the surface of the variable resistance film 12. An optical path difference occurs geometrically between the optical path proceeding in the direction $D_{90}$ and the optical path proceeding in the direction $D_{30}$. Therefore, the degree of the attenuation of the photoelectrons 23 is different according to the direction of the detection. Further, the optical path difference increases as the position of the atoms 22 is deeper. Accordingly, the difference of the degree of the attenuation of the photoelectrons 23 increases as the position of the atoms 22 is deeper. Stated conversely, the position of the atoms 22 can be known to be deeper as the intensity difference of the photoelectrons 23 due to the detection direction increases.

Figure 4A:
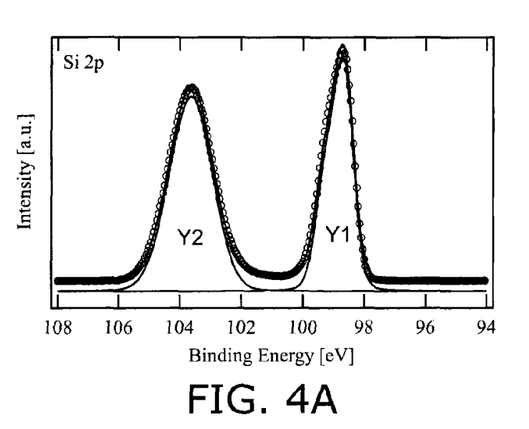
Figure 4B:
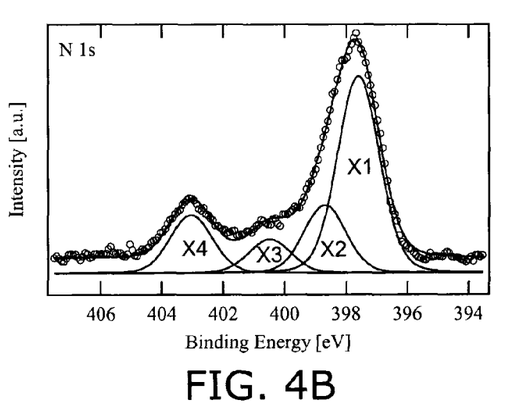
Figure 4C:
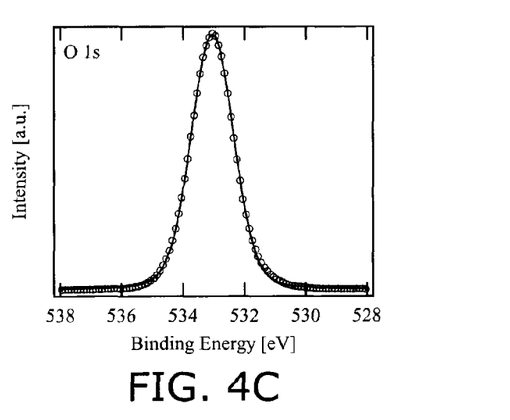

FIG. 4A to FIG. 4C are graphs showing X-ray photoelectron spectra of the variable resistance film, where the horizontal axis is the binding energy, and the vertical axis is the intensity of the photoelectrons; FIG. 4A shows the 2p orbital (Si 2p) photoelectron spectrum; FIG. 4B shows the 1s orbital (N 1s) photoelectron spectrum of nitrogen; and FIG. 4C shows the 1s orbital (O 1s) photoelectron spectrum of oxygen.

In the 2p orbital (Si 2p) photoelectron spectrum of silicon as shown in FIG. 4A, the thickness of the silicon oxynitride film can be determined from the intensity ratio of a component Y1 corresponding to the silicon substrate and a component Y2 corresponding to the silicon oxynitride film. The thickness corresponds to the thickness of the variable resistance film 12, i.e., the total thickness of the resistance change layer 12a and the resistance change layer 12b.

When charge correction of the 1s orbital (N 1s) photoelectron spectrum of nitrogen with the is orbital (C 1s) photoelectron spectrum (not shown) of carbon is performed as shown in FIG. 4B, peaks are detected in the binding energy range of 396 to 404 eV. Peak fitting can be performed by separating the spectrum into four components using the Voigt function. Specifically, the peak fitting can be performed by defining components X2, X3, and X4 having binding energy differences of 1.0 eV, 1.8 eV, and 2.7 eV using a component X1 as a reference. On the actual spectrum, the component X1 appears in the range of about 396 to about 398 eV; and the component X2 appears in the range of about 398 to about 400 eV.

Then, the nitrogen and oxygen concentrations inside the silicon oxynitride film can be estimated by measuring the ratio of the surface area of each (N 1s) peak of the components X1 to X4 shown in FIG. 4B and the peak surface area of the (O 1s) photoelectron spectrum shown in FIG. 4C from the directions of the take-off angles of 90° and 30°.

Figure 5:
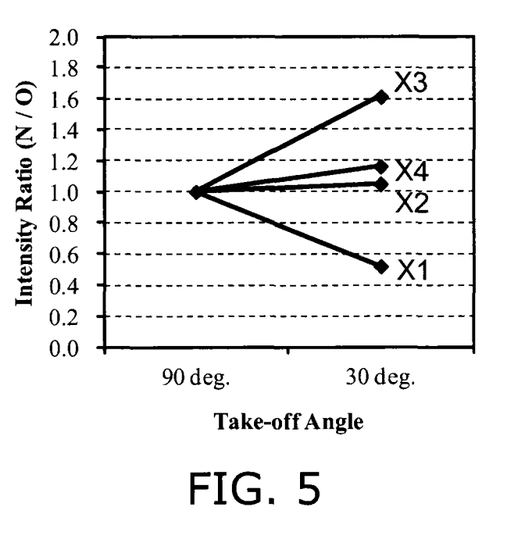
FIG. 5 is a graph showing the effects of the take-off angle on the intensity ratio of the photoelectrons of nitrogen and oxygen, where the horizontal axis is the take-off angle; and the vertical axis is the (N/O) ratio.

FIG. 5 is a graph showing the effects of the take-off angle on the intensity ratio of the photoelectrons of nitrogen and oxygen, where the horizontal axis is the take-off angle; and the vertical axis is the (N/O) ratio.

The vertical axis of FIG. 5 shows a relative change amount in which the case where the (N/O) ratio of the take-off angle is 90° is taken to be 1.

In the variable resistance film 12 that is made of silicon oxynitride, the component segregating on the ion source electrode 13 side, i.e., the front surface side, increases when changing the take-off angle from 90° to 30°; and the component segregating on the opposing electrode 11 side, i.e., the bottom surface side, decreases when changing the take-off angle from 90° to 30°. It can be seen that the component X1 segregates on the opposing electrode 11 side, i.e., the bottom surface side, because the component X1 decreases when the take-off angle is changed from 90° to 30°. On the other hand, it can be seen that the component X2 is distributed uniformly inside the variable resistance film 12 because there is little change when the take-off angle is changed from 90° to 30°. In other words, the component X1 is the component corresponding to the resistance change layer 12a; and the component X2 is the component corresponding to the resistance change layer 12b.

When the concentration distribution of the nitrogen is calculated by using the values of Scofield as sensitivity coefficients of the elements of the X-ray photoelectron spectrum and the value derived by TPP-2M as the photoelectron attenuation length, the nitrogen concentration of the resistance change layer 12a is in the range of not less than 2 at % and not more than 15 at %; and the thickness of the resistance change layer 12a is not more than 1 nm. On the other hand, the nitrogen concentration of the resistance change layer 12b is less than 2 at %.

Although an example in which the take-off angles are 90° and 30° is illustrated in the embodiment, the embodiment is not limited thereto; and the calculations may be performed using other take-off angles. Further, three or more take-off angles may be used without problems. In the case where a continuous concentration distribution in the depth direction is estimated from multiple take-off angles, the resistance change layer 12a may be considered to be the portion of the variable resistance film 12 where the nitrogen concentration is in the range of not less than 2 at % and not more than 15 at %; and the resistance change layer 12b may be considered to be the portion where the nitrogen concentration is in the range of less than 2 at %.

Third Embodiment

Figure 6A:
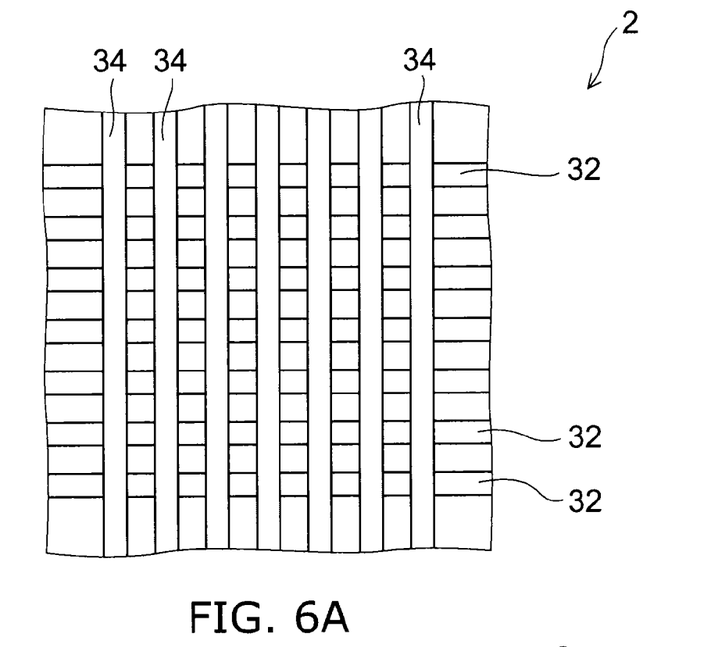
FIG. 6A is a plan view showing a resistance random access memory device according to a third embodiment.
Figure 6B:
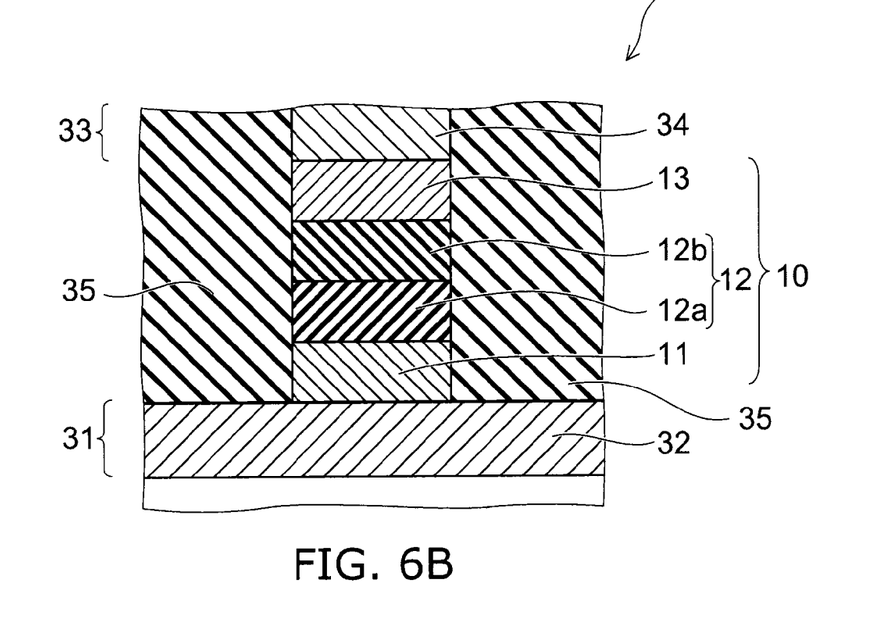
FIG. 6B is a cross-sectional view showing a cross-point portion of the device shown in FIG. 6A.

FIG. 6A is a plan view showing a resistance random access memory device according to the embodiment; and FIG. 6B is a cross-sectional view showing a cross-point portion of the device shown in FIG. 6A.

As shown in FIG. 6A and FIG. 6B, the resistance random access memory device 2 according to the embodiment is an example in which the memory element 10 described in the first embodiment described above is included in a cross-point structure.

A lower interconnect layer 31 is provided in the resistance random access memory device 2. Multiple lower interconnects 32 extending in the first direction are provided in the lower interconnect layer 31. An upper interconnect layer 33 is provided on the lower interconnect layer 31. Multiple upper interconnects 34 extending in the second direction are provided in the upper interconnect layer 33. The second direction is a direction that crosses, e.g., is orthogonal to, the first direction.

Then, the memory element 10 described above is connected at the cross-point portions between each of the lower interconnects 32 and each of the upper interconnects 34. Continuing, an inter-layer insulating film 35 is filled between the lower interconnects 32, the upper interconnects 34, and the memory elements 10. Thereby, the multiple memory elements 10 are included in a cell array structure arranged in a matrix configuration.

The thickness and the nitrogen concentration of the resistance change layers 12a and 12b for such a cell array structure can be estimated by measuring the X-ray photoelectron spectra for the resistance change layers 12a and 12b of the cross-point portions.

For example, X-ray photoelectron spectroscopy is performed after exposing the variable resistance film 12 by polishing or etching. Then, if the proportion of the total surface area of the memory elements 10 in the entire device is considered, it is possible to measure the nitrogen concentration of the resistance change layers 12a and 12b using a discussion similar to that of the second embodiment described above.

Further, in the case where the material of the inter-layer insulating film 35 is a material such as silicon nitride that includes nitrogen, it is sufficient to perform X-ray photoelectron spectroscopy after removing the inter-layer insulating film 35 while leaving the lower interconnects 32, the upper interconnects 34, and the memory elements 10 by, for example, performing wet etching using an aqueous phosphoric acid solution.

The thickness of the entire variable resistance film 12 also can be measured using a scanning transmission electron microscope. For example, a cross-sectional sample of the memory element 10 is made using a focused-ion beam; and the thickness of the entire variable resistance film 12 can be measured by measuring a high-angle annular dark-field image using a scanning transmission electron microscope. Also, the nitrogen concentration and the thickness can be determined for the resistance change layer 12a and for the resistance change layer 12b by estimating the nitrogen concentration of the variable resistance film 12 by performing electron energy loss spectroscopy using a scanning transmission electron microscope. In such a case, it is sufficient to calibrate the quantitative value by using a cross-sectional sample having a known nitrogen concentration and a known thickness in the cross-sectional direction as a standard sample.

According to the embodiments described above, a resistance random access memory device having good data retention characteristics can be realized.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A resistance random access memory device, comprising:
a first electrode;
a second electrode comprising material selected from the group consisting of silver, copper, zinc, gold, titanium, nickel, cobalt, tantalum, aluminum, and bismuth, alloys thereof, and silicides thereof; and
a variable resistance film provided between the first electrode and the second electrode, the variable resistance film comprising silicon oxynitride,
the variable resistance film comprising:
a first resistance change layer having a first nitrogen concentration; and
a second resistance change layer having a second nitrogen concentration lower than the first nitrogen concentration.

2. The resistance random access memory device according to claim 1, wherein a thickness of the variable resistance film is not more than 4 nm.

3. The resistance random access memory device according to claim 1, wherein a thickness of the first resistance change layer determined from a photoelectron spectrum is not more than 1 nm.

4. The resistance random access memory device according to claim 1, wherein the nitrogen concentration of the first resistance change layer is not less than 2 at % and not more than 15 at %.

5. The resistance random access memory device according to claim 4, wherein the nitrogen concentration of the first resistance change layer is determined from a photoelectron spectrum.

6. The resistance random access memory device according to claim 1, wherein the nitrogen concentration of the second resistance change layer is less than 2 at % and not less than 0 at %.

7. The resistance random access memory device according to claim 6, wherein the nitrogen concentration of the second resistance change layer is determined from a photoelectron spectrum.

8. The resistance random access memory device according to claim 1, further comprising a layer comprising silicon disposed between the first electrode and the variable resistance film or between the variable resistance film and the second electrode.

9. The resistance random access memory device according to claim 1, further comprising a layer comprising a metal oxide disposed between the first electrode and the variable resistance film or between the variable resistance film and the second electrode.

10. The resistance random access memory device according to claim 1, further comprising:
- a first interconnect layer comprising a plurality of first interconnects extending in a first direction; and
- a second interconnect layer comprising a plurality of second interconnects extending in a second direction crossing the first direction,
- a stacked body comprising the first electrode, the variable resistance film, and the second electrode being disposed between each of the first interconnects and each of the second interconnects.

* * * * *